United States Patent [19]

Noseyama

[11] Patent Number: 5,796,622
[45] Date of Patent: Aug. 18, 1998

[54] APPARATUS FOR LOGICAL SIMULATION AND METHOD FOR PRODUCING LOGICAL CIRCUIT DATA

[75] Inventor: Hajime Noseyama, Tokyo, Japan

[73] Assignee: NEC Corporation, Tokyo, Japan

[21] Appl. No.: 682,971

[22] Filed: Jul. 18, 1996

[30] Foreign Application Priority Data

Jul. 18, 1995 [JP] Japan ................................. 7-181363

[51] Int. Cl.$^6$ ..................................................... G06F 15/60
[52] U.S. Cl. ..................... 364/489; 364/488; 395/500
[58] Field of Search ........................... 395/500; 364/488, 364/489, 490, 491, 578, 570, 716.03; 371/22.1, 22.2

[56] References Cited

U.S. PATENT DOCUMENTS

| 4,703,435 | 10/1987 | Darringer et al. | 364/489 |
|---|---|---|---|
| 4,816,999 | 3/1989 | Berman et al. | 364/489 |
| 5,218,557 | 6/1993 | Simoudis | 364/578 |
| 5,345,393 | 9/1994 | Ueda | 364/489 |
| 5,657,240 | 8/1997 | Chakradhar et al. | 364/488 |

FOREIGN PATENT DOCUMENTS 4-033060  2/1992  Japan ............................. G06F 15/60

Primary Examiner—Kevin J. Teska
Assistant Examiner—Matthew Loppnow
Attorney, Agent, or Firm—Foley & Lardner

[57] ABSTRACT

In a logical synthesize design for an ASIC using a general purpose macro, to execute automatically retrieval/elimination of a redundancy function at a function level and to optimize the circuit precisely and speedily, a redundancy conditional statement retrieval unit 3 comprises a conditional statement retrieval unit 31 for retrieving a conditional statement to indicate a condition of an output versus an input from an input macro logical descriptive data; a state transition display descriptive addition unit 32 for producing an intermediate logical descriptive data to which a state transition data is added based on the retrieved conditional statement; a logical simulation unit 34 for executing a logical simulation of an operation mode control data and an input macro logical descriptive data to output status value data; an invariable conditional statement discrimination unit 36 for discriminating and extracting an invariable conditional statement having an invariable status value, based on the status value data; and an invariable conditional statement elimination unit 37 for eliminating the aforementioned invariable conditional statement from the input macro logical descriptive data based on the aforementioned discrimination result and for producing a new logical description.

2 Claims, 3 Drawing Sheets

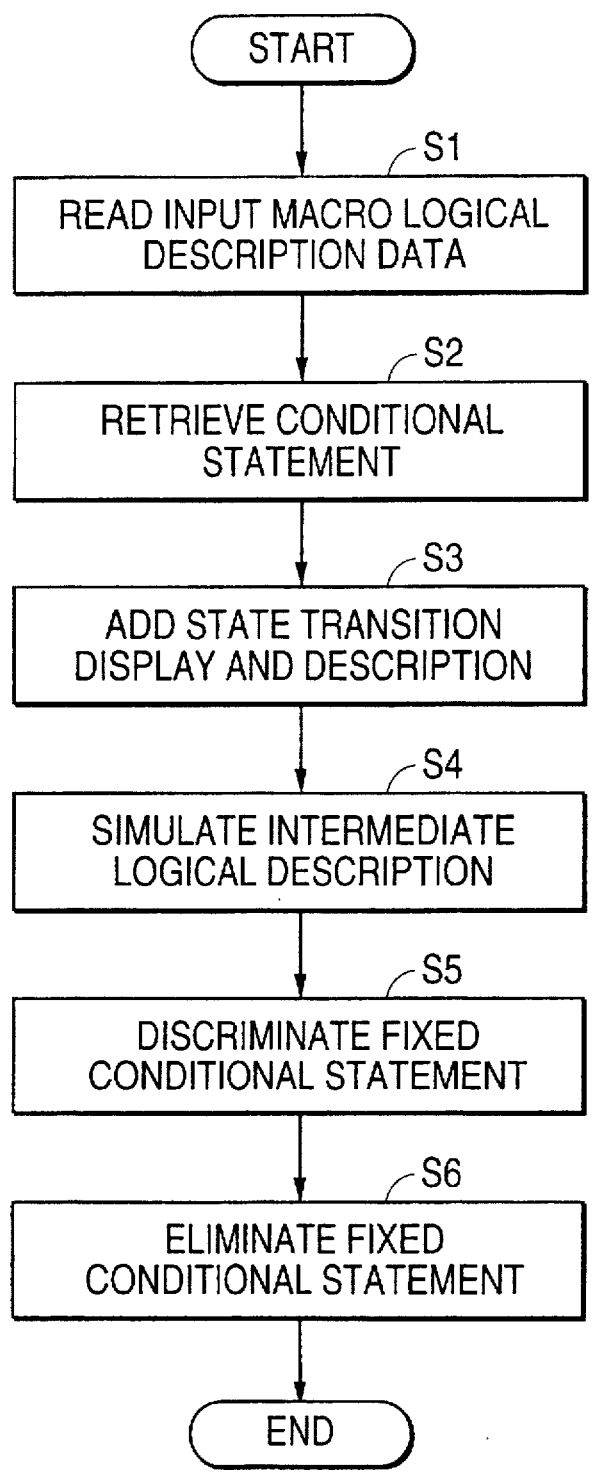

APPARATUS FOR LOGICAL SIMULATION AND METHOD FOR PRODUCING LOGICAL CIRCUIT DATA

BACKGROUND OF THE INVENTION

1. Field of the Invention

The present invention relates to an apparatus for logical simulation and a method for producing logical circuit data, more particularly to an apparatus for logical simulation and a method for producing logical circuit data for use in designing a logical integrated circuit of ASIC (application specific IC) using a general purpose macro.

2. Description of the Related Art

When a logical circuit such as an ASIC is designed, a general purpose macro offered by an ASIC vendor, which consists of function blocks such as NAND and FF, generally includes unnecessary redundancy functions in response to user's individual demands. For this reason, as a result, the redundancy functions remains in the ASIC circuit designed by the user. This has been factors of useless area and useless power consumption.

In the design of the ASIC, a method for producing logical circuit data for deleting the redundancy functions from the circuits included in the general purpose macro has been executed in such a manner that the designer retrieves, under the use condition of the circuits at a gate level, the inoperative gates included in these circuits and eliminates such gates so as not to affect the performance of another circuit. To execute this method, the redundancy function circuits at the gate level are retrieved in trial and error, and the retrieved redundancy function circuits are deleted. Subsequently, by executing the logical simulation for the general purpose macro, the validity of the circuit after the deletion of the redundancy function circuit is evaluated. If improperness is found, the logical simulations are repeated after the amendment.

A second conventional method for producing logical circuit data is disclosed in Japanese Laid Open Patent No. Heisei 4-33060, wherein when there are unconnected terminals in any of output terminals of the general purpose macro, by automatically deleting the logic gates connected to the unconnected terminals, the redundancy logic gates are deleted. However, even though all of the terminals of such general purpose macro were connected to the output terminals, redundancy circuits are inherently present from the necessity of the macro function, in general. It is difficult to delete the redundancy functions completely.

In the above-described first conventional apparatus for logical simulation and the method for producing logical circuit data, the designer tries the retrieval/deletion of the redundancy function circuits at the gate level in accordance with his own judgement. Therefore, the designer commits much erroneous operations, and he spends much time for retrieval and delete operations. Moreover, it is difficult to delete the redundancy function circuits completely. Even though he finds the redundancy function circuits, it is difficult for him to judge, at the gate level, the area to be deleted. The retrieval/deletion of the redundancy function circuits step takes a long time, since it is carried out in accordance with the designer's judgement.

Furthermore, in the above-described second conventional apparatus for logical simulation and the method for producing logical circuit data, even though all of the terminals in the general purpose macro are the redundancy circuits are inherently present from the necessity of the macro function. Therefore, it is difficult to delete all of the redundancy functions of the circuit.

SUMMARY OF THE INVENTION

The object of the present invention is to provide an apparatus for a logical simulation and a method for producing logical circuit data, in which the automatic elimination of a redundancy function of circuit is realized, and the shortening of a turn around time in designing the circuit is achieved, and the area of the circuit is reduced.

An apparatus for a logical simulation of the present invention comprises:

redundancy function elimination means for executing a first logical simulation based on first logical descriptive data of a macro and operation mode control data of a logical design circuit, the macro being a ready-made circuit whose function is predefined, for eliminating unnecessary redundancy functions in aforementioned logical design circuit from the macro, and for producing a third logical descriptive date;

logical synthesizing means for executing a predetermined logical synthesis from the aforementioned third logical descriptive data and for producing an output logical circuit at a gate level;

second logical simulation means for executing a simulation of the aforementioned output logical circuit.

The aforementioned redundancy function elimination means comprises, conditional statement retrieval/means for retrieving a conditional statement for indicating a condition of an output versus an input from the aforementioned first logical descriptive data;

state transition display descriptive addition means for producing a second logical descriptive data to which a predefined state transition data is added based on the aforementioned retrieved conditional statement;

first logical simulation means for receiving the aforementioned operation mode control data and the aforementioned second logical descriptive data to execute a logical simulation and for outputting status value data which is a result of the simulation;

invariable conditional statement discrimination means for discriminating and extracting an invariable conditional statement having an invariable status value, based on the aforementioned status value data; and invariable conditional statement elimination means for eliminating the aforementioned invariable conditional statement from the aforementioned first conditional descriptive data based on the aforementioned discrimination result and for producing a third logical description.

A method for producing logical circuit data wherein a first logical simulation is executed based on a first logical descriptive data of macro and operation mode control data of a logical design circuit, the macro being a ready-made logical circuit whose function is predefined, and eliminates unnecessary redundancy function in the aforementioned logical design circuit of the aforementioned macro to produce a third logical descriptive data comprises:

a conditional statement retrieval step for executing conditional statement retrieval indicating a condition of an output versus an input from the aforementioned first logical descriptive data;

a state transition display description addition step for adding a state transition display description predefined based on the aforementioned retrieved conditional statement and for producing a second logical descriptive data;

a status value data output step for receiving the aforementioned operation mode control data and the aforementioned second logical descriptive data to execute a first logical simulation and for outputting status value data which is the simulation result;

an invariable conditional statement discrimination step for discriminating an invariable conditional statement whose status value is invariable, based on the aforementioned status value data; and an invariable conditional statement elimination step for eliminating the aforementioned invariable conditional statement from the aforementioned first logical descriptive data, based on the aforementioned discrimination result.

BRIEF DESCRIPTION OF THE DRAWINGS

In the accompanying drawings, there are shown illustrative embodiment of the present invention from which these and other of its objects, novel features, and advantages will be readily apparent.

In the drawings:

FIG. 2 is a flow chart showing processing flows in a method for producing logical circuit data of the present invention.

DESCRIPTION OF THE PREFERRED EMBODIMENT

Figure 1:
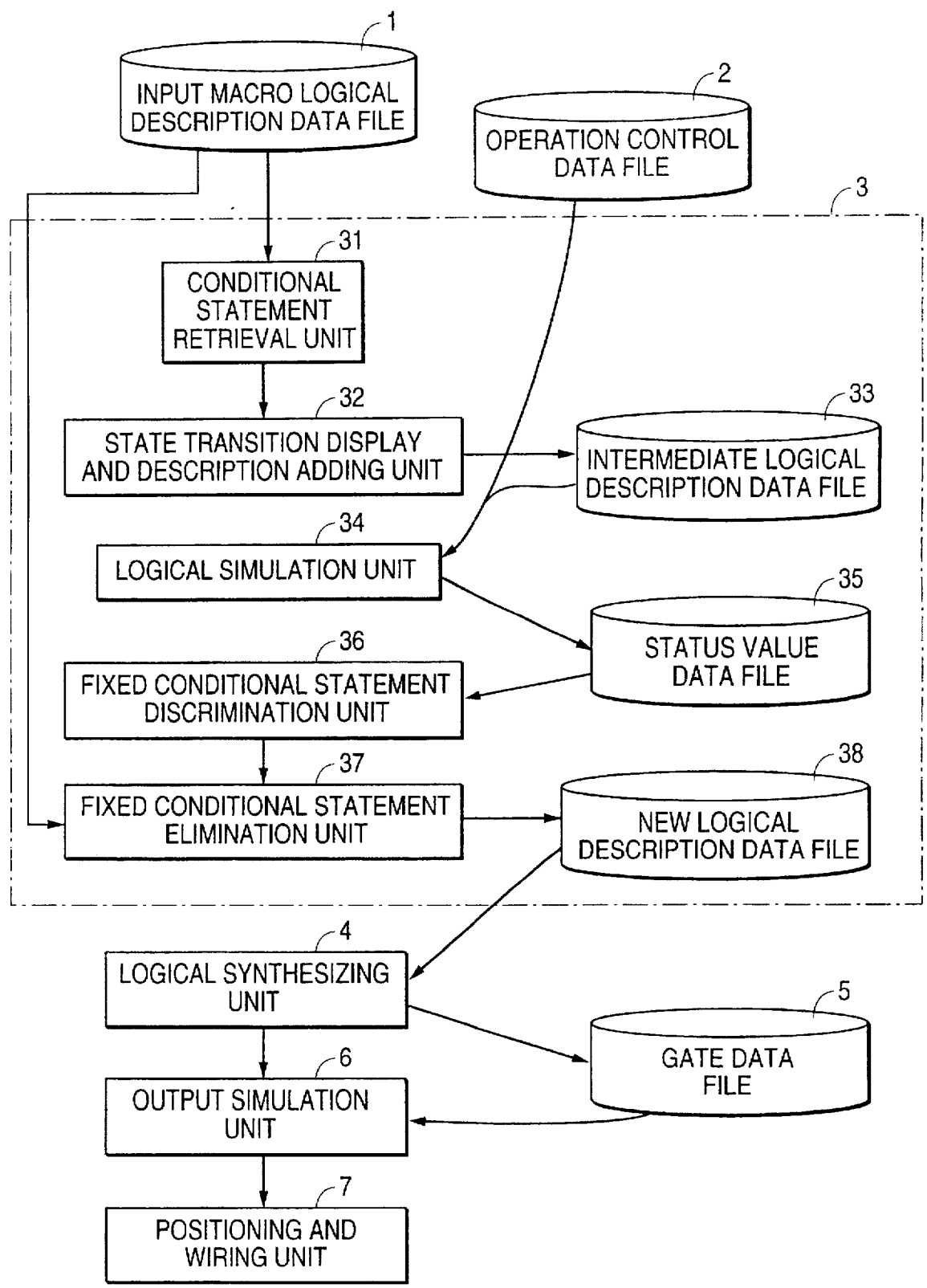
FIG. 1 is a block diagram showing a form of an embodiment of an apparatus for logical simulation of the present invention.

Next, referring to FIG. 1 showing a form of an embodiment of the present invention by a block diagram, an apparatus of logical simulation which is a form of an embodiment shown in this drawing comprises an input logical descriptive file 1 which stores input macro logical descriptive data serving as an input at a function level of macro function; an operation mode control data file 2 which stores operation mode control data; redundancy function deletion unit 3 which executes an invariable conditional statement elimination having an invariable status value from the input macro logical descriptive data in accordance with a simulation result based on the operation mode control data; a logical synthesizing unit 4 which synthesizes newly a logical circuit at a gate level after the redundancy function elimination; a gate file 5 which stores an output logical circuit at the gate level defined as the result of logical synthesis; an output simulation unit 6 which execute the simulation of the output logical circuit; and a tool 7 for positioning and wiring which executes positioning and wiring for an actual semiconductor substrate of the output logical circuit defined as a result of the simulation.

The redundancy function elimination unit 3 comprises a conditional statement retrieval unit 31 which retrieves a conditional statement from an input macro logical descriptive data; a state transition display description addition unit 32 which adds state transition data based on the retrieved conditional statement and produces intermediate logical description data; an intermediate logical description file 33 which stores the intermediate logical description data; a logical simulation unit 34 which executes a logical simulation by the operation mode control data and reads out data from the intermediate description file 33 and outputs status value data of the simulation result; a status value data file 35 which stores the status value data; an invariable conditional statement discrimination unit 36 which discriminates and extracts an invariable conditional statement corresponding to the redundancy function based on read out status value data from the status value data file 35; an invariable conditional status elimination unit 37 which eliminates the invariable conditional status from the input macro logical description data based on the aforementioned discrimination result and produces a new logical description; and a new logical description file 38 which stores the new logical description.

Figure 3A:
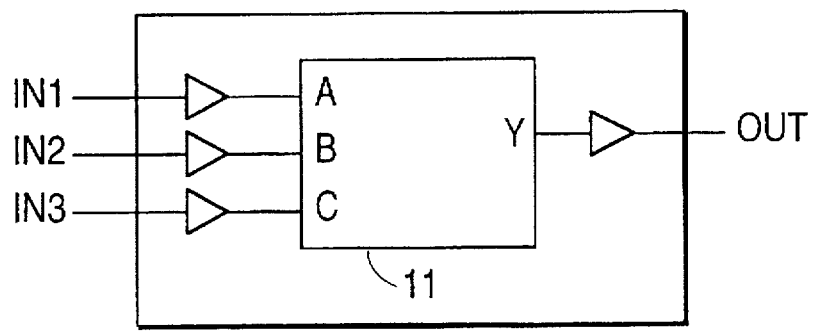
FIGS. 3(a) is a circuit diagram at a function level.

Next, referring to FIG. 1, FIG. 2 showing the processing flow with the flow chart, and FIGS. 3(A) which is a circuit diagram at a function level, and FIGS. 3(B) and 3(C) which are circuit diagrams at a gate level, the method for producing logical circuit data which is a form of an embodiment of the present invention will be described.

First, in the step S1, the conditional statement retrieval unit 31 receives the input macro logical description data from the input macro logical description file 1. FIG. 3(A) showing the circuit diagram at the function level is referenced as an example of this input macro logical description data. In the circuit shown in FIG. 3(A), three inputs IN1 to IN3 are connected to corresponding terminals A to C of a gate circuit 11 via buffer amplifiers. A terminal Y of the gate circuit 11 is connected to an output terminal OUT via a buffer amplifier.

Figure 3B:
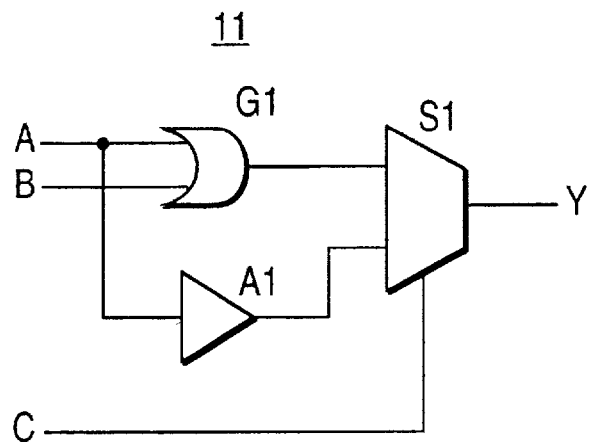
FIGS. 3(b) and 3(c) are circuit diagrams at a gate level.
Figure 3C:

Referring to FIG. 3(B) which is a circuit diagram showing the gate circuit 11 at the gate level, the gate circuit 11 comprises a two input OR gate G1 having input terminals connected to corresponding terminals A and B, a buffer amplifier A1 having an input terminal connected to the terminal A, a selector S1, one input terminal of which is connected to the output terminal of the OR gate G1, the other input terminal of which is connected to the output terminal of the buffer amplifier A1, a control terminal of which is connected to the terminal C, and an output terminal of which is connected to the terminal Y. Macro description data of FIGS. 3(A) and 3(B) are shown Table 1.

TABLE 1

A=IN1
B=IN2
C=IN3
Y=OUT
if C= =1 then
    Y=B+A
else
    Y=B
endif

Next, by using the conditional statement retrieval unit 31, in the step S2, the conditional statement of the logical description in the Table 1 is retrieved. The conditional statement to be retrieved is from "if" to "end if" of FIG. 1.

Subsequently, by using the state transition display description addition unit 32, in the step S3, the state transition description statement "print C" is added to the conditional statement retrieved in the previous step S2 in order to reflect the state transition on the simulation result. The intermediate logical description shown in FIG. 2 is made and it is stored in the intermediate logical description file 33.

TABLE 2

```
A=IN1
B=IN2
C=IN3
Y=OUT
print C
if C==1 then
        Y=B+A
else
        Y=B
endif
```

Next, in the step S4, using the logical simulation unit 34, the logical simulation as to the intermediate logical description is executed. At this execution of the logical simulation, the operation mode control data shown in the Table 3 is used as evaluation simulation patterns. As a result of this logical simulation, as shown in the Table 4, the status value data represented as the state transition of the conditional statement by the value of the terminal C as shown in the Table 4 is output and it is stored in the status value data file 35.

TABLE 3

| IN1 | IN2 | IN3 | OUT |
|-----|-----|-----|-----|
| 0   | 0   | 1   | 0   |
| 0   | 1   | 1   | 1   |
| 1   | 0   | 1   | 1   |
| 1   | 1   | 1   | 1   |
| 0   | 0   | 1   | 0   |
| 1   | 1   | 1   | 1   |

TABLE 4

| IN1 | IN2 | IN3 | OUT | C |
|-----|-----|-----|-----|---|
| 0   | 0   | 1   | 0   | 1 |
| 0   | 1   | 1   | 1   | 1 |
| 1   | 0   | 1   | 1   | 1 |
| 1   | 1   | 1   | 1   | 1 |
| 0   | 0   | 1   | 0   | 1 |
| 1   | 1   | 1   | 1   | 1 |

Subsequently, in the step S5, using the invariable conditional statement discrimination unit 36, the portion where all of the status value data are fixed either to "1" or to "0", that is, the portion where the conditional statement is an invariable condition, is eliminated from the status value data obtained as the result of the simulation shown in the Table 4. Here, the conditional status value data are fixed to "C=IN3=1".

Next, in the step S6, using the variable conditional statement elimination unit 37, the variable conditional portion, that is, "Y=B" is eliminated from the input macro logical descriptive data in the Table 1. The new logical descriptive data shown in the Table 5 are made.

TABLE 5

```
A=IN1
B=IN2
C=IN3
Y=OUT
Y=B+A
```

By eliminating the conditional statements according to the procedures described above, in the circuit of this embodiment, the Table 5 can be obtained by eliminating the redundancy functions from the Table 1. When the logical descriptions in the Tables 1 and 5 are made in the circuit at the gate level, FIGS. 3(B) and 3(C) are obtained. When both of FIGS. 3(B) and 3(C) are compared, the OR gate G1 only constitutes the new logical circuit of FIG. 3(C)

Therefore, it is apparent that the reduction in the circuit area (approximately, reduced to ⅓) and the elimination of the unnecessary terminal C are realized by the elimination of the macro redundancy functions.

It is a matter of course that the present invention is applicable to logical descriptive language VHD1 and Verilog-HD1, the formats of which have been already open, as the function level logical description in the form of this embodiment.

As described above, in the apparatus for logical simulation and the method for producing logical circuit data, the functional redundancy elimination unit comprises the conditional statement retrieval unit; the state transition display description addition unit; the first logical simulation unit which receives the operation mode control data and the second logical descriptive data to execute the logical simulation and outputs the status value data; the invariable conditional statement discrimination unit which discriminates and extracts the invariable conditional statement based on the aforementioned status value data; and the invariable conditional statement elimination unit which eliminates the aforementioned invariable conditional statement from the aforementioned input logical descriptive data based on the discrimination result and produces the third logical description. The logical descriptive conditional statement of the input macro is retrieved, and the invariable condition is discriminated by using the simulation result of the logical description to which the state transition display statement is added. By eliminating this invariable conditional from the original logical description, the redundancy function of the circuit is completely eliminated. Therefore, it is possible to eliminate the redundancy function of the circuit automatically. Shortening of a turn around time (TAT) in the circuit design can be realized. Furthermore, the number of the elements in an integrated circuit can be reduced so that the area of the circuit can be reduced. This results in the reduce in cost.

What is claimed is:

1. An apparatus for a logical simulation comprising:
   redundancy function elimination means for executing a first logical simulation based on first logical descriptive data of a macro and operation mode control data of a logical design circuit, said macro being a ready-made circuit the function of which is predefined, for eliminating unnecessary redundancy functions in said logical design circuit from said macro, and for producing a third logical descriptive data;
   logical synthesizing means for executing a predetermined logical synthesis from said third logical descriptive data and for producing an output logical circuit at a gate level;
   second logical simulation means for executing a simulation of said output logical circuit;
   said redundancy function elimination means comprises,
   conditional statement retrieval means for retrieving a conditional statement to indicate a condition of an output versus an input from said first logical descriptive data;
   state transition display descriptive addition means for producing a second logical descriptive data to which a predefined state transition data is added based on said retrieved conditional statement;

first logical simulation means for receiving said operation mode control data and said second logical descriptive data to execute a logical simulation and for outputting status value data which is a result of the simulation;

invariable conditional statement discrimination means for discriminating and extracting an invariable conditional statement having an invariable status value, based on said status value data; and invariable conditional statement elimination means for eliminating said invariable conditional statement from said first conditional descriptive data based on said discrimination result and for producing a third logical description.

2. A method for producing logical circuit data wherein a first logical simulation is executed based on a first logical descriptive data of macro and operation mode control data of a logical design circuit, the macro being a ready-made logical circuit whose function is predefined, and eliminates unnecessary redundancy function in said logical design circuit of said macro to produce a third logical descriptive data comprises:

a conditional statement retrieval step for executing conditional statement retrieval, indicating a condition of an output versus an input from said first logical descriptive data;

a state transition display description addition step for adding a state transition display description predefined based on said retrieved conditional statement and for producing a second logical descriptive data;

a status value data output step for receiving said operation mode control data and said second logical descriptive data to execute a first logical simulation and for outputting status value data which is the simulation result;

an invariable conditional statement discrimination step for discriminating an invariable conditional statement whose status value is invariable, based on said status value data; and an invariable conditional statement elimination step for eliminating said invariable conditional statement from said first logical descriptive data, based on said discrimination result.

\* \* \* \* \*